(12) United States Patent
Wang et al.

(10) Patent No.: US 12,650,648 B2
(45) Date of Patent: Jun. 9, 2026

(54) METHOD TO REDUCE LINE EDGE ROUGHNESS FOR EUV PHOTORESIST PATTERN

(71) Applicant: Applied Materials, Inc., Santa Clara, CA (US)

(72) Inventors: Xinke Wang, Singapore (SG); Zeqing Shen, San Jose, CA (US); Susmit Singha Roy, Campbell, CA (US); Abhijit Basu Mallick, Sunnyvale, CA (US); Bhaskar Jyoti Bhuyan, San Jose, CA (US); Jiecong Tang, Singapore (SG); John Sudijono, Singapore (SG); Mark Saly, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 957 days.

(21) Appl. No.: 17/872,370

(22) Filed: Jul. 25, 2022

(65) Prior Publication Data

US 2024/0027912 A1     Jan. 25, 2024

(51) Int. Cl.
*G03F 7/40*     (2006.01)
*G03F 7/34*     (2006.01)
(Continued)

(52) U.S. Cl.
CPC .............. *G03F 7/40* (2013.01); *G03F 7/346* (2013.01); *H10P 14/6902* (2026.01); *H10P 76/405* (2026.01); *H10P 76/4085* (2026.01)

(58) Field of Classification Search
CPC . G03F 7/40; G03F 7/346; G03F 7/167; H01L 21/02115; H01L 21/0332;
(Continued)

(56) References Cited

U.S. PATENT DOCUMENTS

2014/0272728 A1     9/2014  Sinclair et al.
2017/0178920 A1*    6/2017  Dole ................. H01J 37/32889
(Continued)

FOREIGN PATENT DOCUMENTS

JP     2017044993 A     3/2017
JP     2019212776 A     12/2019
(Continued)

OTHER PUBLICATIONS

"Orientation-controlled molecule-by-molecule polymer wire growth by the carrier-gas-type organic chemical vapor deposition and the molecular layer deposition", Yoshimura, Tetsuzo; Ito, Shinji; Nakayama, Tomohiro; Matsumoto, Kotaro, Applied Physics Letters vol. 91, Issue 3, pp. 033103/1-3, 2007 (Year: 2007).*
(Continued)

*Primary Examiner* — Jonathan Johnson
*Assistant Examiner* — Alexander N. Lee
(74) *Attorney, Agent, or Firm* — Servilla Whitney LLC

(57)     ABSTRACT

Methods of depositing a conformal carbon-containing film on an EUV photoresist to reduce line edge roughness (LER) are described. Exemplary processing methods may include flowing a first precursor over a patterned EUV surface to form a first portion of an initial carbon-containing film on the structure. The methods may include removing a first precursor effluent from the patterned EUV photoresist. A second precursor may then be flowed over the patterned EUV photoresist to react with the first portion of the initial carbon-containing film. The methods may include removing a second precursor effluent from the patterned EUV photoresist. The methods may include etching the substrate to remove a portion of the carbon-containing film and expose a top surface of the patterned surface and expose the substrate between the patterned surfaces.

19 Claims, 3 Drawing Sheets

(51) Int. Cl.
  *H10P 14/69* (2026.01)
  *H10P 76/40* (2026.01)
(58) Field of Classification Search
  CPC .......... H01L 21/0337; H01L 21/02205; H01L
    21/0228; H10P 14/6902; H10P 76/405;
    H10P 76/4085; H10P 14/6339; H10P
    14/668; H10P 76/204
  See application file for complete search history.

(56) References Cited

U.S. PATENT DOCUMENTS

| | | | |
|---|---|---|---|
| 2018/0173109 A1 | 6/2018 | Gronheid et al. | |
| 2018/0342388 A1 | 11/2018 | Chakraborty et al. | |
| 2019/0041756 A1* | 2/2019 | Hasebe ................... | C23C 16/02 |
| 2019/0157066 A1* | 5/2019 | Zhou ................... | H01L 21/7684 |
| 2020/0006080 A1 | 1/2020 | Osawa et al. | |
| 2020/0312672 A1* | 10/2020 | Yamaguchi ........ | C08G 18/3228 |
| 2021/0175092 A1 | 6/2021 | Tois et al. | |
| 2022/0028686 A1 | 1/2022 | Bhuyan et al. | |

FOREIGN PATENT DOCUMENTS

| | | |
|---|---|---|
| JP | 2021155848 A | 10/2021 |
| KR | 20220011589 A | 1/2022 |
| WO | 2022016126 A1 | 1/2022 |

OTHER PUBLICATIONS

"EUV photolithography: resist progress and challenges", Christopher K. Ober, Hong Xu, Vasiliki Kosma, Kazunori Sakai, Emmanuel P. Giannelis, Extreme Ultraviolet (EUV) Lithography IX, Proc. of SPIE vol. 10583, 2018 (Year: 2018).*

Klepper, Karina Barnholt, et al., "Atomic layer deposition of organic-inorganic hybrid materials based on saturated linear carboxylic acids", Dalton Trans., 2011, 40, 4636.

Liu, Eric , et al., "Line edge roughness (LER) reduction strategies for EUV self-aligned double patterning (SADP)", Proc. of SPIE vol. 11615 1161506-1.

Oyakhire, Solomon T., et al., "Methyl-methacrylate based aluminum hybrid film grown via three-precursor molecular layer deposition", J. Vac. Sci. Technol. A 40, 023405 (2022); doi: 10.1116/6. 0001505.

Wada, Toshiharu , et al., "Line Roughness Improvements on EUV 36nm Pitch Pattern by Plasma Treatment Method", Proc. of SPIE vol. 10963 1096301-1.

Zhang, Chao , et al., "Area-Selective Molecular Layer Deposition of Polyimide on Cu through Cu-Catalyzed Formation of a Crystalline Interchain Polyimide", Chem. Mater. 2020, 32, 5073-5083.

PCT International Search Report and Written Opinion in PCT/US2023/028088 mailed Nov. 14, 2023, 9 pages.

\* cited by examiner

100

105

100

105

METHOD TO REDUCE LINE EDGE ROUGHNESS FOR EUV PHOTORESIST PATTERN

TECHNICAL FIELD

Embodiments of the disclosure relate to methods for depositing a carbon-based film on nanostructures. In particular, embodiments of the disclosure are directed to methods of depositing carbon-based films to improve line edge roughness and/or line width roughness (LWR) of a patterned EUV photoresist.

BACKGROUND

Photolithography employs photoresists, which are photosensitive films, for transfer of negative or positive images onto a substrate, e.g., a semiconductor wafer. Subsequent to coating a substrate with a photoresist, the coated substrate is exposed to a source of activating radiation, which causes a chemical transformation in the exposed areas of the surface. The photoresist coated substrate is then treated with a developer solution to dissolve or otherwise remove either the radiation-exposed or unexposed areas of the coated substrate, depending on the type of photoresist employed.

Lithographic techniques for creation of features having sizes of thirty nanometers or less, however, suffer from a number of shortcomings. For example, line width variations of a resist film produced by such techniques can be too large to be acceptable in view of tightening dimensional tolerances typically required in this range, e.g., tolerances of the order of the scales of the molecular components of the resist film. Such linewidth variations may be classified as line edge roughness (LER) and/or line width roughness (LWR).

Line edge roughness and line width roughness reflect linewidth fluctuations that may lead to variations in device characteristics. As critical dimensions for integrated circuits continued to shrink, linewidth fluctuations will play an increasingly significant role in critical dimensions (CD) error budget for lithography. Several suspected sources of LER and LWR in resist patterns include the reticle quality, the aerial image quality, and resist material properties.

Extreme ultraviolet (EUV) lithography (EUVL) shows promise as a next generation lithography technique. Current key challenges of EUV technology include photoresist roughness. Currently, plasma post-treatment is used to smooth the photoresist surface, but such plasma post-treatment may damage the photoresist pattern or reduce the photoresist heigh.

There is an ongoing need in the art, therefore, for alternative methods of reducing line edge roughness for EUV photoresist patterns.

SUMMARY

One or more embodiments of the disclosure are directed to a method of depositing a carbon-containing film. The method comprises: flowing a first precursor over an EUV photoresist comprising a patterned surface to form a first portion of a carbon-containing film on the patterned surface, the first precursor comprising a first reactive group; removing a first precursor effluent comprising the first precursor from the EUV photoresist; flowing a second precursor comprising a second reactive group over the EUV photoresist to react with the first reactive group to form the carbon-containing film conformally on the patterned surface; and removing a second precursor effluent comprising the second precursor from the EUV photoresist.

Another embodiment of the disclosure is directed to a method of depositing a carbon-containing film. The method comprises: flowing a first precursor over an EUV photoresist comprising a patterned surface, the first precursor having a general formula $R^1$—$(X)_n$ wherein $R^1$ comprises one or more of an alkyl group, an alkenyl group, an aryl group, an aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the first precursor reacts with a reactive group on the patterned surface to form a first portion of a carbon-containing film; removing a first precursor effluent comprising the first precursor from the EUV photoresist; flowing a second precursor over the EUV photoresist, the second precursor having a general formula $R^2$—$(Y)_n$ wherein $R^2$ comprises one or more of an alkyl group, an alkenyl group, an aryl group, an aromatic group, and a cycloalkyl group, $Y_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the second precursor reacts with the first portion to form a conformal carbon-containing film; removing a second precursor effluent comprising the second precursor from the EUV photoresist; and etching the EUV photoresist to remove a portion of the carbon-containing film from a top surface of the patterned surface.

A further embodiment of the disclosure is directed to a method of reducing line edge roughness (LER) of an EUV photoresist. In one or more embodiments, the method comprises molecular layer deposition of a carbon-containing film on a patterned surface of the EUV photoresist, wherein the molecular layer deposition comprises: flowing a first precursor over the EUV photoresist comprising the patterned surface to form a first portion of the carbon-containing film on the patterned surface, the first precursor comprising a first reactive group; removing a first precursor effluent comprising the first precursor from the EUV photoresist; flowing a second precursor comprising a second reactive group over the EUV photoresist to react with the first reactive group to form the carbon-containing film conformally on the patterned surface; and removing a second precursor effluent comprising the second precursor from the EUV photoresist, wherein the carbon-containing film is formed on a sidewall of the EUV photoresist and reduces line edge roughness (LER).

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
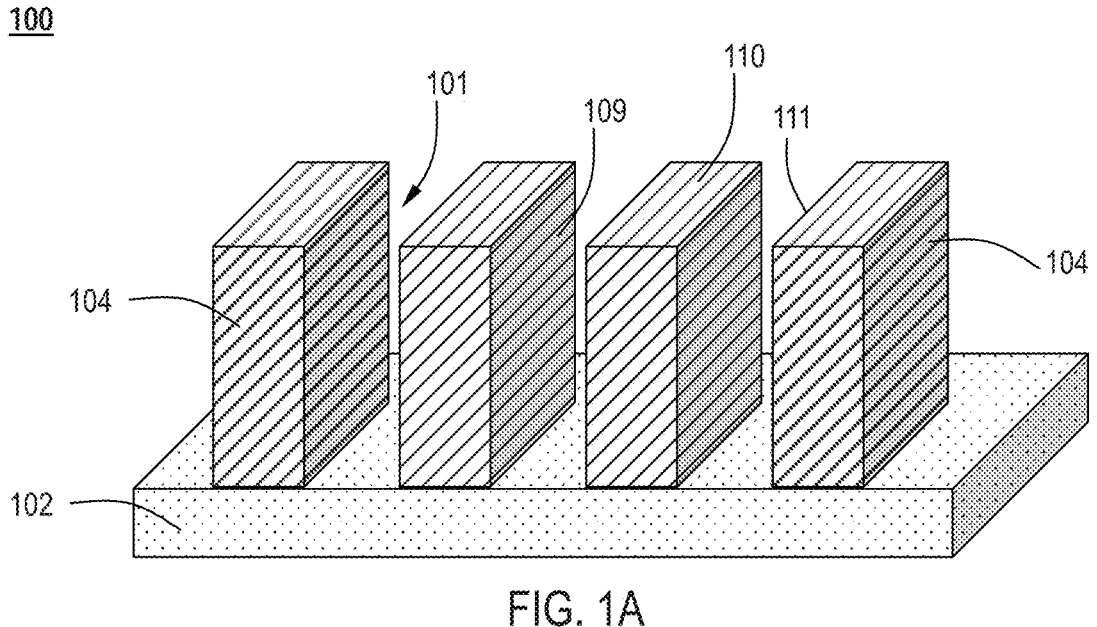
FIG. 1A illustrates a cross-section view of a substrate according to one or more embodiments.

Before describing several exemplary embodiments of the invention, it is to be understood that the invention is not limited to the details of construction or process steps set forth in the following description. The invention is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate. Substrates may have various dimensions, such as 200 mm or 300 mm diameter wafers, as well as rectangular or square panes. In some embodiments, the substrate comprises a rigid discrete material.

The term "on" indicates that there is direct contact between elements. The term "directly on" indicates that there is direct contact between elements with no intervening elements.

As used herein, "extreme UV", "EUV", or the like, refers to radiation in the approximate range of 10 nm to 124 nm. In some embodiments, EUV radiation (also referred to as EUV light) in the range of 10 nm to 15 nm. In one or more embodiments, EUV light at a wavelength of about 13.5 nm is employed.

As used in this specification and the appended claims, the terms "precursor," "reactant," "reactive gas" and the like are used interchangeably to refer to any gaseous species that can react with the substrate surface.

As used in this specification and the appended claims, the terms "reactive compound", "reactive gas", "reactive species", "precursor", "process gas" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the two or more reactive compounds which are introduced into a reaction zone of a processing chamber.

Carbon-containing materials may be used in semiconductor device manufacturing for a number of structures and processes, including as a mask material, an etch resistant material, and a trench fill material, among other applications. More specific examples of applications for carbon-containing materials include the formation of hot implant hard masks, metal gate (MG)-cut hard masks, metal gate fabrication, and reverse tone patterning, self-aligned patterning, among others. One or more embodiments includes the formation of these carbon-containing materials using molecular layer deposition (MLD) as film on a patterned EUV photoresist.

Embodiments of the disclosure provide methods of depositing a film (e.g., carbon-containing) on features with small dimensions. Some embodiments advantageously provide conformal films to completely cover features. Other embodiments advantageously provide conformal films that completely or partially cover features. The carbon-containing film of one or more embodiments has a high conformality. In one or more embodiments, the conformal carbon-containing film is deposited on an EUV photoresist.

Embodiments of the present technology include molecular layer deposition (MLD) methods and systems to form a carbon-containing material on a patterned photoresist. Exemplary MLD methods may include providing a first deposition precursor to a surface of a patterned EUV photoresist, where the precursor forms a first layer (e.g., a first monolayer) on mandrel surfaces. During or after the formation of the first layer, unbound deposition effluents, which may include unbound molecules of the first deposition precursor, are removed from a processing region in which the patterned EUV photoresist is exposed. A second deposition precursor may then be introduced to the patterned EUV photoresist, where molecules of the second deposition precursor bind to reactive moieties on the first layer to form a second layer (e.g., a second monolayer) on the patterned surface. During or after the formation of the second layer, unbound deposition effluent, which may include unbound molecules of the second deposition precursor, are removed from the processing region. The patterned EUV photoresist now has a carbon containing material layer bound to the patterned mandrel surface of the EUV photoresist. Additional compound layers of first and second layers may be built up on the deposited layers until the number of built-up compound layers reaches a desired thickness of carbon-containing material on the patterned surface of the EUV photoresist. The compound layers may then be annealed, or plasma treated to form the carbon-containing material on the surface of the EUV photoresist.

One or more embodiments advantageously provides solutions to problems with conventional methods of forming a carbon-containing material on an EUV photoresist. For example, the present technology forms a carbon-containing material with significantly fewer voids, fractures, and other physical defects than carbon-containing materials formed using spin-on-carbon (SOC) and flowable chemical-vapor-deposition (FCVD) methods. The present technology may also form carbon-containing materials with higher density and lower porosity than materials formed with SOC and FCVD. The high levels of hydrogen found in many SOC and FCVD precursors result in high levels of shrinkage when the as-deposited materials are treated to form a final material. Shrinkage as high as 50 vol. % is not uncommon for as-deposited SOC and FCVD materials following treatment, which creates gaps, fractures, and voids in treated material, as well as stresses on substrate features in contact with the material. The present technology produces carbon-containing materials with less than 10 vol. % shrinkage of the as-deposited material (e.g., 5-10 vol. % shrinkage, less than about 5 vol. % shrinkage).

One or more embodiments advantageously provides solutions to problems with conventional plasma deposition methods of forming a carbon-containing material on an EUV photoresist. Conventional plasma deposition methods such as plasma-enhanced chemical-vapor-deposition (PECVD) and high-density-plasma chemical-vapor-deposition (HDPCVD) often create ion sputtering that causes damage to substrate features on the EUV photoresist and can also create re-sputtered ions and other species that can cause defects in the deposited carbon-containing material. In addition, they often deposit the material unevenly in and around substrate features, creating voids in and around substrate trenches and steps, and uneven surfaces in planar substrate regions. The present technology may form carbon-containing materials with a high level of conformity in narrow substrate features (e.g., dimension widths less than about 25 nm) and high aspect ratios (e.g., AR of 10:1 or more) without the need for plasmas that can damage the substrate feature during deposition.

The embodiments of the disclosure are described by way of the Figures, which illustrate devices (e.g., transistors) and processes for forming semiconductor structures in accordance with one or more embodiments of the disclosure. The processes shown are merely illustrative possible uses for the disclosed processes, and the skilled artisan will recognize that the disclosed processes are not limited to the illustrated applications.

Figure 1B:
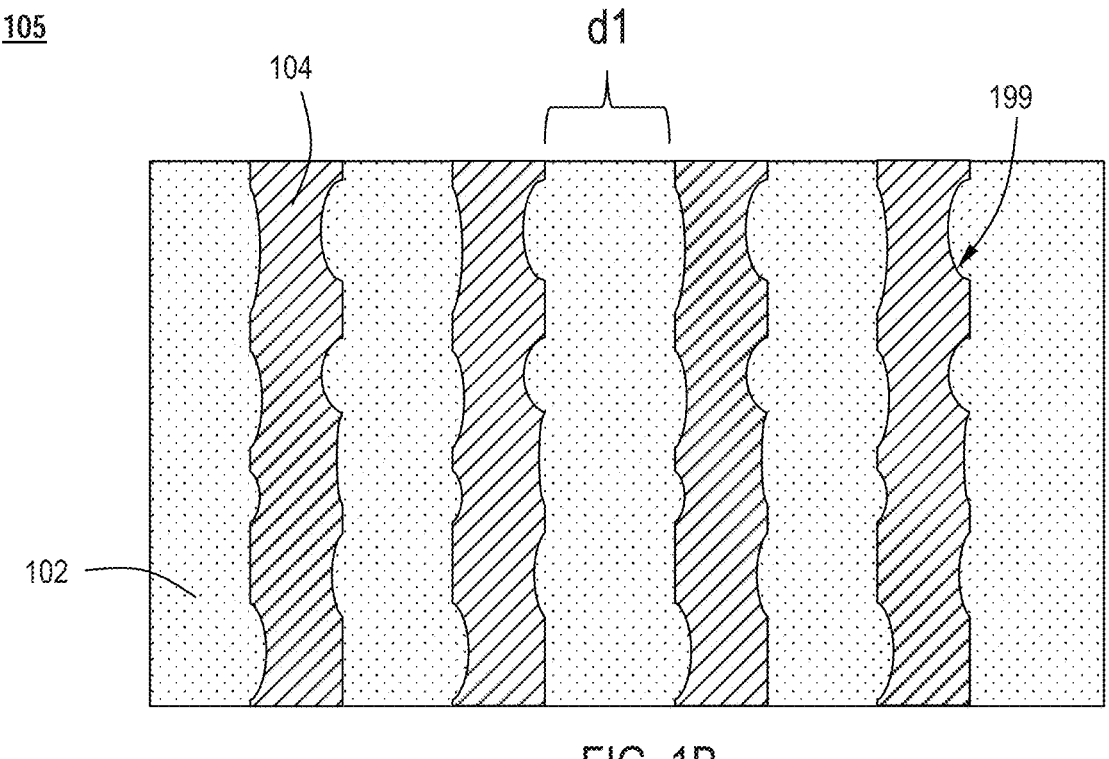
FIG. 1B illustrates a cross-section view of a substrate according to one or more embodiments.
Figure 1C:
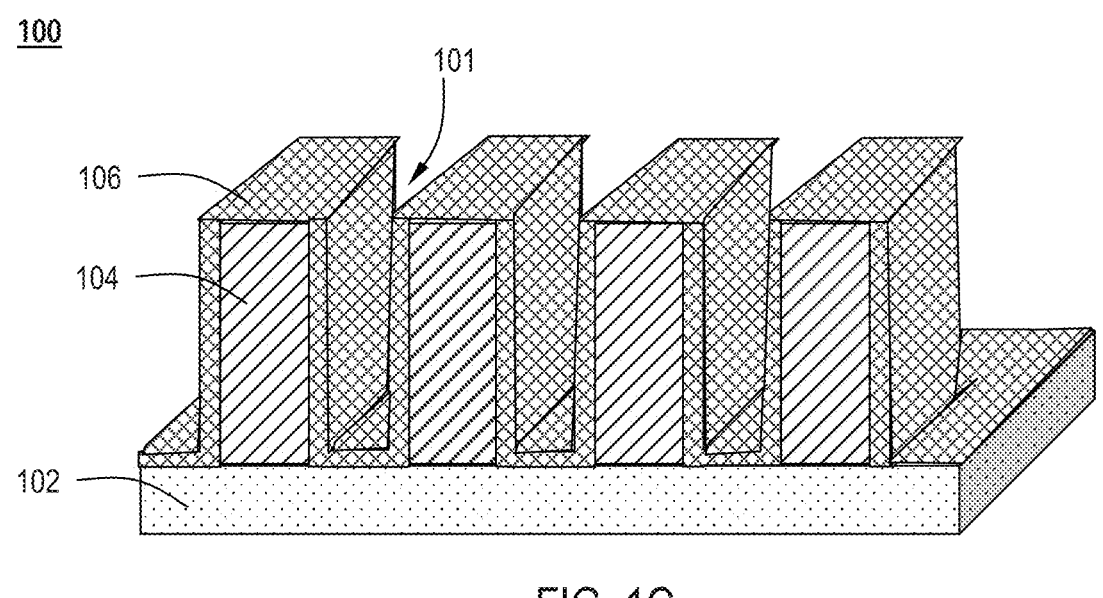
FIG. 1C illustrates a cross-section view of a substrate according to one or more embodiments.
Figure 1D:
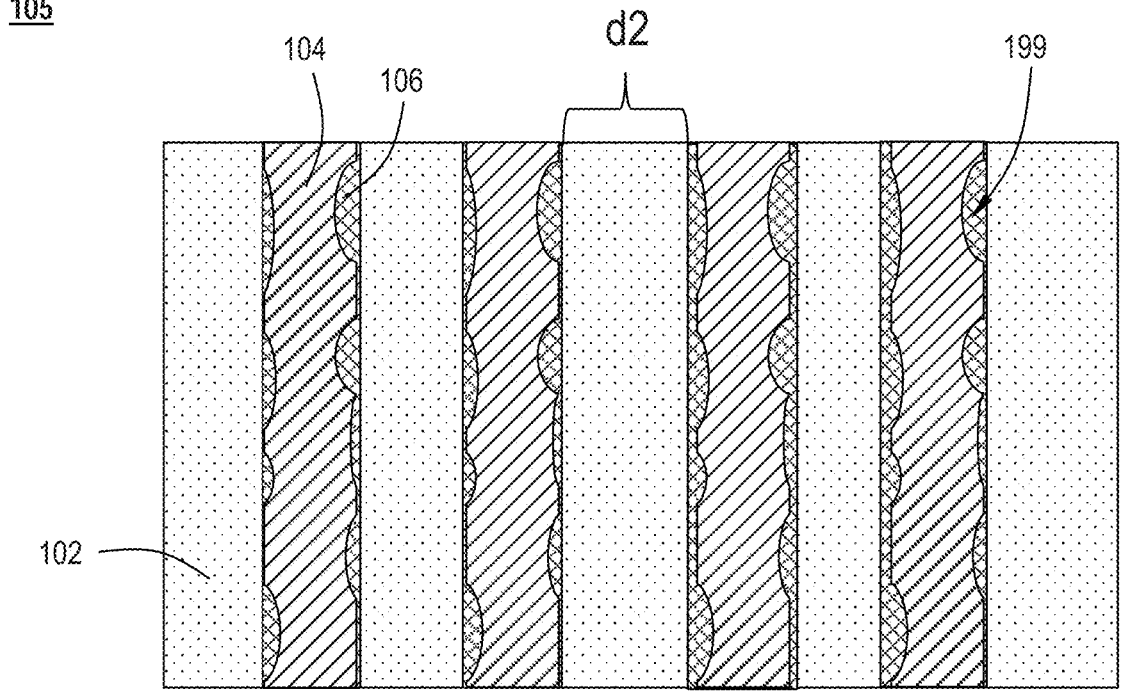
FIG. 1D illustrates a cross-section view of a substrate according to one or more embodiments.
Figure 2:
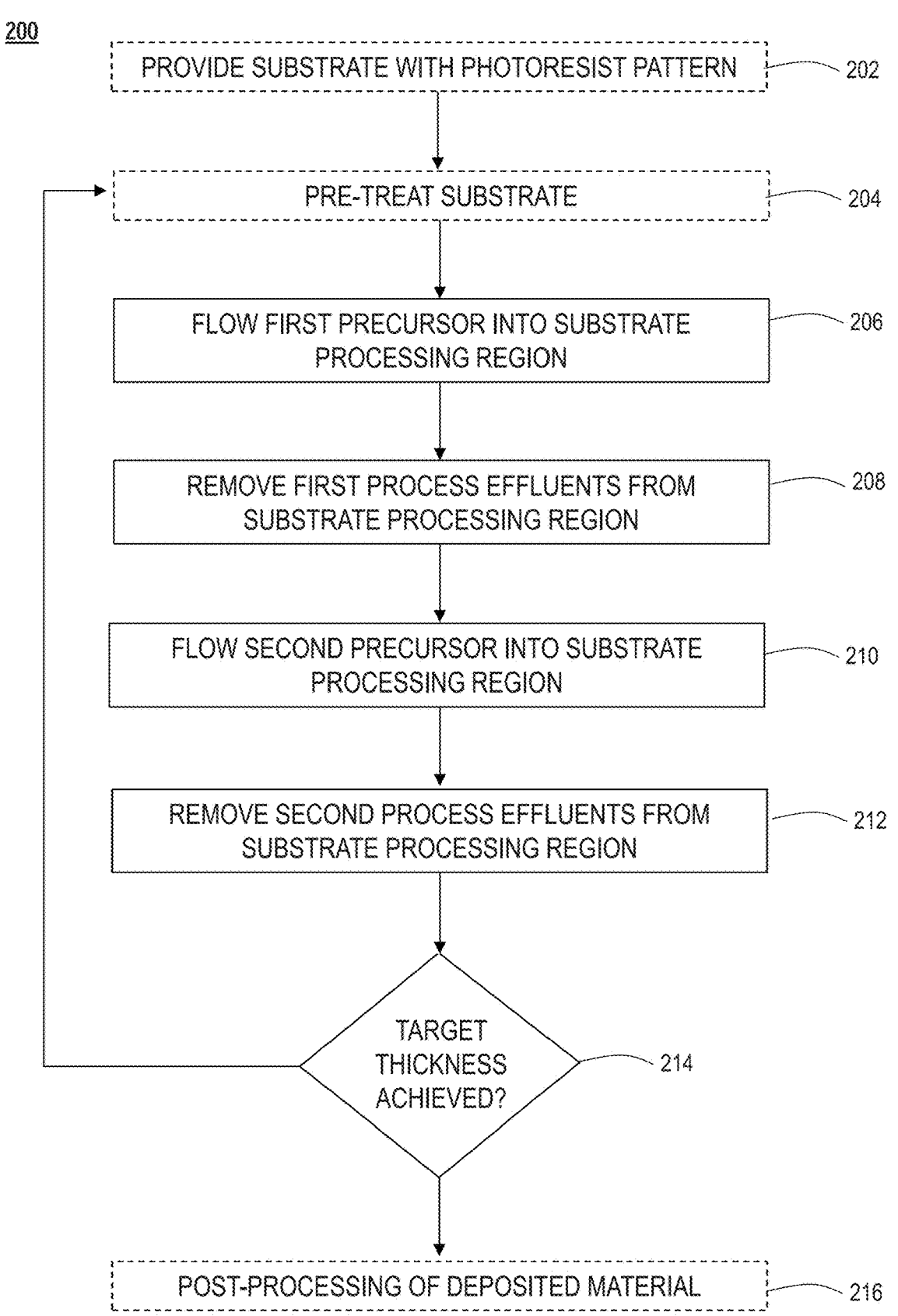
FIG. 2 illustrates a process flow diagram of a method of depositing a film on a substrate according to one or more embodiments.

FIGS. 1A-1D illustrate cross-sectional views of an EUV photoresist being processed according to the method of one or more embodiments. FIG. 2 illustrates a process flow diagram of a method 200 of depositing a carbon-containing film according to one or more embodiments. Referring to FIGS. 1A-1D and FIG. 2, in one or more embodiments, at operation 202, a patterned EUV photoresist is provided. As used in this specification and the appended claims, the term "provided" means that the substrate is made available for processing (e.g., positioned in a processing chamber). FIG. 1A is a cross-section view 100 of an EUV photoresist being processed according to the method of FIG. 2. FIG. 1B is a top view 105 of the EUV photoresist.

Referring to FIG. 1A and FIG. 1B, in one or more embodiments, an EUV photoresist 102 includes a patterned surface 104. In one or more embodiments, the patterned surface 104 comprises one or more of a photoresist, a mandrel, a trench, a via, a hole, and the like. In specific embodiments, the patterned surface 104 comprises a patterned EUV photoresist having photoresist mandrels. A photoresist may be patterned to form the patterned surface 104 using EUV radiation and a developer to expose portions and leave a residue of the photoresist. A "photoresist," as used herein, refers to any light-sensitive material used in such processes as photolithography and photoengraving, to form a patterned coating on a surface. The photoresist patterned surface 104, mandrels, may be formed by one or more of EUV lithography, or deep ultra-violet (DUV) e-beam lithography.

In one or more embodiments, the patterned surface 104 includes a top surface 110, a first sidewall 109, and a second sidewall 111. In one or more embodiments, as illustrated in FIG. 1B, the patterned surface 104 includes multiple surface irregularities 199 such that the patterned surface 104 is rough and is not smooth. In one or more embodiments, the patterned surface 104, which may also be referred to as the photoresist mandrels, may have pattern variation along the line edge (surface irregularities 199), causing line width roughness (LWR) and line edge roughness (LER), which can lead layer-to-layer variations during pattern transfer. Without intending to be bound by theory, in one or more embodiments, a thin molecular layer deposition (MLD) carbon-based film 106 is coated on the photoresist patterns of the patterned surface 104 so as to smooth the photoresist mandrels surface to reduce LWR and LER.

One of skill in the art will recognize that, while not illustrated in FIGS. 1A and 10 for ease of drawing, the surface irregularities 199 are present in the patterned surface 104.

As recognized by one of skill in the art, there may be more than one patterned surface 104, mandrel, on the EUV photoresist 102. In some embodiments, there are at least two patterned surfaces 104 separated by a feature 101.

In one or more embodiments, the patterned surface 104 on which the carbon-containing material is formed may include a material in which one or more features 101 may be formed. The features 101 may be characterized by any shape or configuration according to the present technology. In some embodiments, the features 101 may be or include a trench structure, a via structure, or aperture formed within the substrate. Although the features 101 may be characterized by any shapes or sizes, in some embodiments the substrate features 101 may be characterized by higher aspect ratios, or a ratio of a depth of the feature to a width across the feature 101. For example, in some embodiments substrate features may be characterized by aspect ratios greater than or equal to 5:1, and may be characterized by aspect ratios greater than or equal to 10:1, greater than or equal to 15:1, greater than or equal to 20:1, greater than or equal to 25:1, greater than or equal to 30:1, greater than or equal to 40:1, greater than or equal to 50:1, or greater. Additionally, the features 101 may be characterized by narrow widths or diameters across the feature including between two sidewalls, such as a critical dimension in a range of from 5 nm to 500 nm, or in a range of from 10 nm to 200 nm, or in a range of from 20 nm to 100 nm.

In one or more embodiments, the distance, d1, between each of the patterned surfaces 104 is in a range of from 5 nm to 500 nm, or in a range of from 10 nm to 200 nm, or in a range of from 20 nm to 100 nm.

FIG. 10 is a cross-section view 100 of an EUV photoresist being processed according to the method of FIG. 2. FIG. 1D is a top view 105 of the EUV photoresist. Referring to FIGS. 10 and 1D, and to FIG. 2, in one or more embodiments, at operation 204, the EUV photoresist 102 and patterned surface 104 may optionally be exposed to a pretreatment process to polish, coat, dope, etch, reduce, oxidize, hydroxy-late, anneal, UV cure, e-beam cure and/or bake the substrate.

In one or more embodiments, a carbon-containing film 106 forms substantially conformally on the EUV photoresist 102 and patterned surface 104. As used herein, a layer which is "substantially conformal" refers to a layer where the thickness is about the same throughout (e.g., on the top, middle and bottom of sidewalls and on the bottom of the feature 101). A layer which is substantially conformal varies in thickness by less than or equal to about 10%, 9%, 8%, 7%, 6%, 5%, 4%, 3%, 2%, 1%, or 0.5%.

With reference to FIG. 2, at operation 206, a first type of precursor is introduced/flowed into the substrate processing region of a processing chamber and over the substrate surface. The first precursor binds strongly to the EUV photoresist 102 and patterned surface 104.

In one or more embodiments, the first precursor may be a carbon-containing precursor that has at least two reactive groups that can form a bond with a group attached to the EUV photoresist 102 and patterned surface 104. Molecules of the first precursor react with the surface groups of the EUV photoresist 102 and patterned surface 104 to form bonds linking the first precursor molecule to the EUV photoresist 102 and patterned surface 104. The reactions between the first precursor molecules and the groups on the EUV photoresist 102 and patterned surface 104 continue until most or all the surface groups are bonded to a reactive group on the first precursor molecules. A first portion of a carbon-containing film 106 is formed that blocks further reaction between first precursor molecules in the first pre-cursor effluent and the substrate.

The first precursor may comprise any suitable precursor known to the skilled artisan. In one or more embodiments, the first precursor may have a general formula $R^1$—$(X)_n$ wherein n is an integer in a range of from 1 to 6, and $R^1$ comprises one or more of an alkyl group, an alkenyl group, an aryl, or aromatic group, and a cycloalkyl group. $X_n$ comprises one or more of a hydroxide group, an aldehyde group, a ketone group, an acid group, an amino group, an isocyanate group, a thiocyanate group, and an acyl chloride group.

Unless otherwise indicated, the term "lower alkyl," "alkyl," or "alk" as used herein alone or as part of another group includes both straight and branched chain hydrocar-bons, containing 1 to 20 carbons, or 1 to 10 carbon atoms, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

Such alkyl groups may optionally include up to 1 to 4 substituents such as halo, for example F, Br, Cl, or I, or $CF_3$, alkyl, alkoxy, aryl, aryloxy, aryl(aryl) or diaryl, arylalkyl, arylalkyloxy, alkenyl, cycloalkyl, cycloalkylalkyl, cycloal-kylalkyloxy, amino, hydroxy, hydroxyalkyl, acyl, het-eroaryl, heteroaryloxy, heteroarylalkyl, heteroarylalkoxy, aryloxyalkyl, alkylthio, arylalkylthio, aryloxyaryl, alky-lamido, alkanoylamino, arylcarbonylamino, nitro, cyano, thiol, haloalkyl, trihaloalkyl, and/or alkylthio, and the like. In one or more embodiments, $R^1$ is independently selected from $C_{1-20}$ alkyl. In other embodiments, $R^1$ is from $C_{1-12}$ alkyl.

As used herein, the term "alkene" or "alkenyl" or "lower alkenyl" refers to straight or branched chain radicals of 2 to 20 carbons, or 2 to 12 carbons, and 1 to 8 carbons in the normal chain, which include one to six double bonds in the normal chain, such as vinyl, 2-propenyl, 3-butenyl, 2-bute-nyl, 4-pentenyl, 3-pentenyl, 2-hexenyl, 3-hexenyl, 2-hepte-nyl, 3-heptenyl, 4-heptenyl, 3-octenyl, 3-nonenyl, 4-dece-nyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonyl-amino, nitro, cyano, thiol, alkylthio, and/or any of the alkyl substituents set out herein.

As used herein, the term "alkynyl" or "lower alkynyl" refers to straight or branched chain radicals of 2 to 20 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloal-kyl, alkyl, alkoxy, alkenyl, alkynyl, aryl, arylalkyl, cycloal-kyl, amino, heteroaryl, cycloheteroalkyl, hydroxy, alkanoy-lamino, alkylamido, arylcarbonylamino, nitro, cyano, thiol, and/or alkylthio, and/or any of the alkyl substituents set out herein.

The term "halogen" or "halo" as used herein alone or as part of another group refers to chlorine, bromine, fluorine, and iodine as well as $CF_3$. As used herein, the term "aryl" refers to monocyclic and bicyclic aromatic groups contain-ing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available car-bon atoms with 1, 2, or 3 substituents, for example, hydro-gen, halo, haloalkyl, alkyl, haloalkyl, alkoxy, haloalkoxy, alkenyl, trifluoromethyl, trifluoromethoxy, alkynyl, and the like.

Specific examples of first precursor include, but are not limited to, one or more of terephthaldehyde, phenylenedi-amine, ethylenediamine, hexamethylenediamine, terephtha-loyl chloride, 1,3,5-benzenetricarbonyl trichloride, pyrom-ellitic dianhydride, benzene-1,3,5-tricarboxaldehyde, 1,4-phenylene diisocyanate, 4,4'-oxydianiline, tris(2-aminoethyl)amine, and the like.

In one or more embodiments, the formation rate of the first portion of the carbon-containing film may depend on the temperature of the substrate as well as the temperature of the deposition precursors that flow into the substrate pro-cessing region. Exemplary substrate temperatures during the formation operations may be greater than or equal to 50° C., greater than or equal to 60° C., greater than or equal to 70° C., greater than or equal to 80° C., greater than or equal to 90° C., greater than or equal to 100° C., greater than or equal to 110° C., greater than or equal to 120° C., greater than or equal to 130° C., greater than or equal to 140° C., greater than or equal to 150° C., or higher. By maintaining the substrate temperature elevated, such as above or about 100° C. in some embodiments, an increased number of nucleation sites may be available along the EUV photoresist 102 and patterned surface 104, which may improve formation and reduce void formation by improving coverage at each loca-tion. In one or more embodiments, the temperature is at a range of from 60° C. to 150° C., or in a range of from 25° C. to 300° C.

The first precursor effluent may remain in the substrate processing region for a period of time to nearly, or completely, form the first portion of the carbon-containing film 106. The precursors may be delivered in alternating pulses to grow the material. In some embodiments, the pulse times of either or both of the first precursor and the second precursor may be greater than or equal to 0.1 seconds, greater than or equal to 1 second, greater than or equal to 2 seconds, greater than or equal to 3 seconds, greater than or equal to 4 seconds, greater than or equal to 5 seconds, greater than or equal to 10 seconds, greater than or equal to 20 seconds, greater than or equal to 40 seconds, greater than or equal to 60 seconds, greater than or equal to 80 seconds, greater than or equal to 100 seconds, or more.

With reference to FIG. 2, at operation 208, the first precursor is purged or removed from the substrate processing region following formation of the first portion 110 of the carbon-containing film 106. The effluents of the first precursor may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, however, increased purge time may begin to remove reactive sites, which may reduce uniform formation. Accordingly, in some embodiments the purge may be performed for less than or equal to 60 seconds and may be performed for less than or equal to 50 seconds, less than or equal to 40 seconds, less than or equal to 30 seconds, or less. In some embodiments, a purge gas may be introduced to the substrate processing region to assist in the removal of the effluents. Exemplary purge gases include argon (Ar), helium (He), and nitrogen ($N_2$), among other purge gases.

Referring to FIG. 2, at operation 210, a second type of precursor, reacts with the first precursor to form a second portion of carbon-containing film 106. The second precursor may advantageously have functional groups on one end that increase the thickness of the carbon-containing film 106.

In one or more embodiments, the second precursor may be a carbon-containing precursor that has at least two reactive groups that can form bonds with unreacted reactive groups of the first precursor that formed the first portion of the carbon-containing film 106. Molecules of the second precursor react with the unreacted reactive groups of the first precursor to form bonds linking the second precursor molecules to the first precursor molecules. The reactions between the second and first precursor molecules continue until most or all the unreacted reactive groups on the first precursor molecules have reacted with second precursor molecules. A second portion of a carbon-containing film 106 of the deposition precursors is formed that blocks further reaction between second precursor molecules in the second precursor effluent and the first portion of the carbon-containing film 106.

The second precursor may comprise any suitable precursor known to the skilled artisan. In one or more embodiments, the second precursor may have a general formula $R^2$—$(Y)_n$ wherein n is an integer in a range of from 1 to 6, and $R^2$ comprises one or more of an alkyl group, an alkenyl group, an aryl, or aromatic group, and a cycloalkyl group. In one or more embodiments, $R^2$ is independently selected from $C_{1-20}$ alkyl. In other embodiments, $R^2$ is from $C_{1-12}$ alkyl. $Y_n$ comprises one or more of a hydroxide group, an aldehyde group, a ketone group, an acid group, an amino group, an isocyanate group, a thiocyanate group, and an acyl chloride group.

Without intending to be bound by theory, it is thought that the second precursor includes a reactive group that can form a covalent bond with a reactive group of the first precursor.

Specific examples of second precursor include, but are not limited to, one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-Oxydianiline, tris(2-aminoethyl)amine, and the like.

Referring to FIG. 2, in one or more embodiments, the method 200 also includes an operation 212 to purge or remove the second precursor effluents from the substrate processing region following the formation of the second portion of the carbon-containing film 106. The effluents may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include argon, helium, and nitrogen, among other purge gases.

In one or more embodiments, the formation rate of the second portion of the carbon-containing film 106 may also depend on the pressure of the second precursor effluent in the substrate processing region. Exemplary effluent pressures in the substrate processing region may range from about 1 mTorr to about 20 Torr. Additional exemplary ranges include 5 Torr to 15 Torr, and 9 Torr to 12 Torr, among other exemplary ranges.

With reference to FIG. 2, in one or more embodiments of the method 200 there is a determination/decision point 214 of whether a target thickness of the as-deposited carbon-containing film 106 on EUV photoresist 102 and patterned surface 104 has been achieved following one or more cycles of forming a carbon-containing film 106 (e.g., following the formation of the first and second portions of a compound layer). If a target thickness of as-deposited carbon-containing film 106 has not been achieved, another cycle of forming first and second portions of a carbon-containing film 106 is performed. If a target thickness of as-deposited carbon-containing film 106 has been achieved, another cycle to form another carbon-containing film 106 is not started. Exemplary numbers of cycles for the formation of carbon-containing films may include 1 cycle to 2000 cycles. Additional exemplary ranges for the number of cycles may include 50 cycles to 1000 cycles, and 100 cycles to 750 cycles, among other exemplary ranges.

Accordingly, in one or more embodiments, the method 200 further includes depositing at least one additional carbon-containing film on the initial carbon-containing film, where the initial carbon-containing film and the at least one additional carbon-containing film form the carbon-containing film 106 on the metal surface of the substrate.

In one or more embodiments, the carbon-containing film 106 may have any suitable thickness. In one or more embodiments, the thickness of the carbon-containing film 106 is in a range of from 0.1 nm to 50 nm, or in a range of from 0.1 nm to 200 nm, or in a range of from 1 nm to 20 nm, or in a range of from 1 nm to 10 nm, or in a range of from 3 nm to 10 nm, or in a range of from 1 nm to 5 nm.

As illustrated in FIG. 1D, the carbon-containing film 106 may form on the patterned surface 104 such as to fill in the surface irregularities 199 of the patterned surface 104, thus decreasing the line edge roughness (LER) of the patterned surface 104 and forming a smooth surface.

In one or more embodiments, the distance, d2, between each of the patterned surfaces 104 after the carbon-containing film is deposited is in a range of from 5 nm to 500 nm, or in a range of from 10 nm to 200 nm, or in a range of from 20 nm to 100 nm. In one or more embodiments, the distance, d2, between each of the patterned surfaces 104 after the carbon-containing film 106 is deposited may be less than the distance, d1, between each of the patterned surface 104 prior to deposition of the carbon-containing film 106.

In the embodiment shown in method 200 of FIG. 2, the as-deposited carbon-containing film 106 on the EUV photoresist 102 and patterned surface 104 may be optionally post-processed at operation 216. The optional post-processing operation 216 can be, for example, a process to modify film properties (e.g., annealing or plasma treatment) or a further film deposition process (e.g., additional ALD or CVD processes) to grow additional films. In some embodiments, the optional post-processing operation 216 can be a process that modifies a property of the deposited film. In some embodiments, the optional post-processing operation 216 comprises annealing the carbon-containing film 106. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the carbon-containing film is annealed for a predetermined time in the range of about 15 seconds to about 90 minutes, or in the range of about 1 minute to about 60 minutes. In some embodiments, annealing the as-deposited carbon-containing film increases the density, decreases the resistivity, and/or increases the purity of the film.

In other embodiments, at operation 216, the carbon-containing film 106 may be subjected to an etching process to remove a portion of the carbon-containing film 106 and expose a top surface 110 of the patterned surface 104 and to expose a portion of the EUV photoresist 102 between the patterned surface 104. The etching processing may be any suitable etching process known to the skilled artisan. In one or more embodiments, the etching process is a dry etching process, e.g., plasma etching or reactive ion etching.

Some embodiments of the disclosure are directed to electronic devices comprising nanostructures having the carbon-containing film 106 as a layer remaining after the etch process removes the carbon-containing film 106 from the bottom part of the trench between the structures. The carbon-containing film 106 may act as an etch protection layer or an etch resistance layer for the sidewall of the nanostructures. In some embodiments, the carbon-containing film 106 acts as a liner material when no etch is performed. In some embodiments, the carbon-containing film 106 acts as a spacer when formed on the sidewall of an EUV photoresist pattern to reduce line edge roughness (LER) and light width roughness (LWR).

In some embodiments, the processing region is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of the spatial ALD process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

In a time-domain ALD process in some embodiments, exposure to each reactive gas, which includes but not limited to the metal and dielectric material to be used for the ALD film, is separated by a time delay to allow each compound to adhere and/or react on the substrate surface and then be purged from the processing chamber. The reactive gases are prevented from mixing by the purging of the processing chamber between subsequent exposures.

In another aspect of a time-domain ALD process of some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. Alternatively, the purge gas may flow continuously throughout the deposition process so that only the purge gas flows during the time delay between pulses of reactive gases. The reactive gases are alternatively pulsed with a pulse of purge gas there between multiple times. The purge may also be achieved with a vacuum pump with or without an inert gas.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/ chemisorb onto substantially the entire surface of the substrate and form a layer of a process gas component thereon.

Once the carbon-containing film is deposited, the method may optionally include further processing (e.g., bulk deposition of a dielectric film). In some embodiments, the further processing may be an ALD process.

The disclosure provides that the processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general-purpose computer into a specific purpose computer (controller) that controls the chamber operation such that the processes are performed. The process can be stored on non-transitory computer readable medium including instructions, that, when executed by a controller of a substrate processing chamber, causes the substrate processing chamber to perform the operations of: flow a first precursor over a substrate comprising a patterned surface to form a first portion of a carbon-containing film on the patterned surface, the first precursor comprising a first reactive group, and the pattern surface comprises a sidewall and a top surface; remove a first precursor effluent comprising the first precursor from the substrate; flow a second precursor comprising a second reactive group over the substrate to react with the first reactive group to form the carbon-containing film on the patterned surface; remove a second precursor effluent comprising the second precursor from the substrate; and etch the substrate to remove a portion of the carbon-containing film from a top surface of the patterned surface to form a spacer layer on a first sidewall and on a second sidewall of the patterned surface.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A molecular layer deposition method comprising:
   flowing a first precursor over an EUV photoresist comprising a patterned surface having surface irregularities to form a first portion of a carbon-containing film on the patterned surface, the first precursor having a general formula $R^1$—$(X)_n$ wherein $R^1$ comprises one or more of an alkyl group, an alkenyl group, an aryl group, an aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6;

removing a first precursor effluent comprising the first precursor from the EUV photoresist;

flowing a second precursor comprising a second reactive group over the EUV photoresist to react with the first precursor to form the carbon-containing film conformally on the patterned surface and to substantially remove the surface irregularities, reducing line edge roughness (LER) and reducing line width roughness (LWR) of the EUV photoresist; and removing a second precursor effluent comprising the second precursor from the EUV photoresist.

2. The method of claim 1, wherein the second precursor has a general formula $R^2$—$(Y)_n$ wherein $R^2$ comprises one or more of an alkyl group, an alkenyl group, an aryl group, an aromatic group, and a cycloalkyl group, $Y_n$ comprises one or more of a hydroxide group, an aldehyde group, a ketone group, an acid group, an amino group, an isocyanate group, a thiocyanate group, and an acyl chloride group, and n is an integer in a range of from 1 to 6.

3. The method of claim 1, wherein the first precursor and the second precursor are independently selected from one or more of terephthaldehyde, phenylenediamine, ethylenediamine, hexamethylenediamine, terephthaloyl chloride, 1,3, 5-benzenetricarbonyl trichloride, pyromellitic dianhydride, benzene-1,3,5-tricarboxaldehyde, 1,4-phenylene diisocyanate, 4,4'-oxydianiline, and tris(2-aminoethyl) amine.

4. The method of claim 3, wherein the first precursor comprises terephthaldehyde and the second precursor comprises phenylenediamine.

5. The method of claim 1, further comprising etching the patterned surface to remove a portion of the carbon-containing film from a top surface of the patterned surface.

6. The method of claim 1, further comprising repeating the method to form the carbon-containing film having a thickness in a range of from 0.1 nm to 50 nm.

7. The method of claim 6, wherein the carbon-containing film has a thickness in a range of from 1 nm to 5 nm.

8. The method of claim 1, wherein removing the first precursor comprises:

flowing a purge gas over the EUV photoresist; and removing a mixture of the first precursor effluent and the purge gas from the EUV photoresist.

9. The method of claim 1, wherein the patterned surface is an EUV photoresist pattern.

10. The method of claim 9, wherein the patterned surface comprises a mandrel.

11. A molecular layer deposition method comprising:

flowing a first precursor over an EUV photoresist comprising a patterned surface having surface irregularities, the first precursor having a general formula $R^1$—$(X)_n$ wherein $R^1$ comprises one or more of an alkyl group, an alkenyl group, an aryl group, an aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the first precursor reacts with a reactive group on the patterned surface to form a first portion of a carbon-containing film;

removing a first precursor effluent comprising the first precursor from the EUV photoresist;

flowing a second precursor over the EUV photoresist, the second precursor having a general formula $R^2$—$(Y)_n$ wherein $R^2$ comprises one or more of an alkyl group, an alkenyl group, an aryl group, an aromatic group, and a cycloalkyl group, $Y_n$ comprises one or more of a hydroxide group, an aldehyde group, a ketone group, an acid group, an amino group, an isocyanate group, a thiocyanate group, and an acyl chloride group, and n is an integer in a range of from 1 to 6, wherein the second precursor reacts with the first portion to form a conformal carbon-containing film having substantially no surface irregularities wherein the carbon-containing film reduces line edge roughness (LER) and reduces line width roughness (LWR) of the EUV photoresist;

removing a second precursor effluent comprising the second precursor from the EUV photoresist; and etching the EUV photoresist to remove a portion of the carbon-containing film from a top surface of the patterned surface.

12. The method of claim 11, wherein the first precursor and the second precursor are independently selected from one or more of terephthaldehyde, phenylenediamine, ethylenediamine, hexamethylenediamine, terephthaloyl chloride, 1,3,5-benzenetricarbonyl trichloride, pyromellitic dianhydride, benzene-1,3,5-tricarboxaldehyde, 1,4-phenylene diisocyanate, 4,4'-oxydianiline, and tris(2-aminoethyl) amine.

13. The method of claim 12, wherein the first precursor comprises terephthaldehyde and the second precursor comprises phenylenediamine.

14. The method of claim 11, wherein removing the first precursor comprises:

flowing a purge gas over the EUV photoresist; and removing a mixture of the first precursor effluent and the purge gas from the EUV photoresist.

15. The method of claim 11, wherein the patterned surface is an EUV photoresist pattern, and the carbon-containing film is formed on a sidewall and reduces line edge roughness (LER).

16. The method of claim 11, wherein the patterned surface comprises a mandrel.

17. The method of claim 11, further comprising repeating the method to form the carbon-containing film having a thickness in a range of from 0.1 nm to 50 nm.

18. The method of claim 17, wherein the carbon-containing film has a thickness in a range of from 1 nm to 5 nm.

19. A method of reducing line edge roughness (LER) of an EUV photoresist, the method comprising molecular layer deposition of a carbon-containing film on a patterned surface of the EUV photoresist, wherein the molecular layer deposition comprises:

flowing a first precursor over the EUV photoresist comprising the patterned surface having surface irregularities to form a first portion of the carbon-containing film on the patterned surface, the first precursor having a general formula $R^1$—$(X)_n$ wherein $R^1$ comprises one or more of an alkyl group, an alkenyl group, an aryl group, an aromatic group, and a cycloalkyl group, $X_n$ comprises one or more of a hydroxide group, an aldehyde group, a ketone group, an acid group, an amino group, an isocyanate group, a thiocyanate group, and an acyl chloride group, and n is an integer in a range of from 1 to 6;

removing a first precursor effluent comprising the first precursor from the EUV photoresist;

flowing a second precursor over the EUV photoresist, the second precursor having a general formula $R^2$—$(Y)_n$ wherein $R^2$ comprises one or more of an alkyl group, an alkenyl group, an aryl group, an aromatic group, and a cycloalkyl group, $Y_n$ comprises one or more of a hydroxide group, an aldehyde group, a ketone group, an acid group, an amino group, an isocyanate group, a thiocyanate group, and an acyl chloride group, and n is an integer in a range of from 1 to 6;

wherein the second precursor reacts with the first precursor to form the carbon-containing film conformally on the patterned surface and to substantially remove the surface irregularities; and removing a second precursor effluent comprising the second precursor from the EUV photoresist, wherein the carbon-containing film is formed on a sidewall of the EUV photoresist and reduces line edge roughness (LER) and line width roughness (LWR) of the EUV photoresist.

* * * * *